US007015639B2

(12) United States Patent
Stegamat et al.

(10) Patent No.: US 7,015,639 B2
(45) Date of Patent: Mar. 21, 2006

(54) ELECTROLUMINESCENT DEVICES AND METHOD OF MAKING TRANSPARENT CATHODES

(75) Inventors: Reza Stegamat, Milpitas, CA (US); Brian H. Cumpston, Pleasanton, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/278,245

(22) Filed: Oct. 22, 2002

(65) Prior Publication Data

US 2004/0075382 A1   Apr. 22, 2004

(51) Int. Cl.
*H05B 33/00* (2006.01)
*H01J 9/14* (2006.01)
(52) U.S. Cl. .......................... 313/504; 313/506; 445/46
(58) Field of Classification Search ................ 313/504, 313/506, 509, 512, 337; 428/690, 917; 315/169.3; 445/35, 46; 427/109; 148/277
See application file for complete search history.

(56) References Cited

U.S. PATENT DOCUMENTS

| | | | |
|---|---|---|---|
| 3,560,784 A | | 2/1971 | Steele et al. |
| 4,277,517 A | * | 7/1981 | Smith, Jr. ................... 148/277 |
| 5,504,389 A | | 4/1996 | Dickey |
| 5,521,759 A | | 5/1996 | Dobrowolski et al. |
| 5,652,067 A | * | 7/1997 | Ito et al. ...................... 428/690 |
| 5,703,436 A | * | 12/1997 | Forrest et al. .............. 313/506 |
| 5,739,545 A | | 4/1998 | Guha et al. |
| 5,821,690 A | | 10/1998 | Martens et al. |
| 5,986,401 A | | 11/1999 | Thompson et al. |
| 6,264,805 B1 | | 7/2001 | Forrest et al. |
| 6,274,980 B1 | | 8/2001 | Burrows et al. |
| 6,402,579 B1 | | 6/2002 | Pichler et al. |
| 6,420,031 B1 | | 7/2002 | Parthasarathy et al. |
| 6,429,451 B1 | * | 8/2002 | Hung et al. ................... 257/40 |
| 6,541,910 B1 | * | 4/2003 | Uchida et al. .............. 313/504 |
| 6,545,409 B1 | * | 4/2003 | Kahen ......................... 313/504 |
| 6,617,052 B1 | * | 9/2003 | Morii .......................... 428/690 |

OTHER PUBLICATIONS

Johnson, David et al., "Contrast Enhancement of OLED Displays", Luxell Technical Paper 33.3, *Society for Information Display ("SID") Proceedings*, 2001.

* cited by examiner

*Primary Examiner*—Karabi Guharay
(74) *Attorney, Agent, or Firm*—Thomas George

(57) ABSTRACT

An embodiment of the present invention pertains to an electrode that is substantially transparent and conductive and that is incorporated within an organic electronic device. This electrode includes a first layer and a second layer that is on the first layer. The electrode optionally includes a third layer on the second layer. The first layer, the second layer, and the third layer are exposed to a medium and reactions between various combinations of the first layer, the second layer, the third layer, and the medium produce the substantially transparent and conductive electrode.

28 Claims, 16 Drawing Sheets

OLED
150

Organic Electronic Device
405

OLED
150

OLED
210

OLED
250

Transparent OLED Display
300

Stacked OLED
330

ELECTROLUMINESCENT DEVICES AND METHOD OF MAKING TRANSPARENT CATHODES

BACKGROUND OF THE INVENTION

1. Field of the Invention

This invention relates generally to an organic electronic device, in particular, to an electrode that is substantially transparent and conductive and incorporated in the organic electronic device.

2. Description of the Related Art

Organic electronic devices include those which convert electrical energy into optical energy, or vice versa, as well as those that detect optical signals through electronic processes. Such organic electronic devices include OLEDs, solar cells, phototransistors, photodetectors, lasers, and opto-couplers. Such devices typically include a pair of electrodes (e.g., an anode and a cathode) with at least one charge-carrying layer between the electrodes. Depending on the function of the device, the charge-carrying layer or layers may be comprised of a material or materials that are electroluminescent when a voltage is applied across the device or the layer or layers may form a heterojunction capable of generating a photovoltaic effect when exposed to optical radiation.

In the particular case of the OLED, the OLED is typically comprised of two or more thin organic layers (e.g., a conducting polymer layer and an emissive polymer layer where the emissive polymer layer emits light) separating its anode and cathode. Under an applied potential, the anode injects holes into the conducting polymer layer, while the cathode injects electrons into the emissive polymer layer. The injected holes and electrons each migrate toward the oppositely charged electrode and produce an electroluminescent emission upon recombination in the emissive polymer layer.

The material that is used as the cathode layer of the OLED is typically multilayer and comprised of generally a thin electron injecting layer that has a low work function and also a thick conductive layer such as aluminium or silver. The electron injecting layer provides an electrically conductive path for current flow as well as a way to efficiently inject electrons into the adjacent emissive polymer layer. The conductive layer has to be thick enough to be adequately conductive, however, the thickness providing adequate conductivity results in the cathode layer being highly reflective. Transparent electrode materials such as indium tin oxide ("ITO") cannot be used as a cathode because it is typically deposited in a manner that causes damage to the organic layer within the OLED and also because it does not have a low work function.

For the foregoing reasons, there exists a need for a cathode that is conductive, substantially transparent, has a low work function, and can be deposited in a manner that doesn't damage the organic layers of the organic electronic device.

In an OLED display, it is difficult to achieve reasonable contrast of the image generated by the display when ambient light emitted from an external bright light source, such as the sun, is reflected from the cathode. In this case, the reflected light from the cathode dominates the magnitude of light produced by the OLED display thereby reducing the perceived contrast of the image generated by the OLED display.

Circular polarizers can be used to improve the contrast of the image generated by the OLED display. The circular polarizer is mounted with adhesive onto the viewing surface of the OLED (for example, the viewing surface may be the bottom of the OLED). The circular polarizer works by absorbing ambient light that reflects from the cathode before it reaches the viewer. One disadvantage of using circular polarizers is that about sixty percent of the light emitted by the OLED is absorbed by the circular polarizer and never reaches the viewer. This absorption results in the necessity to drive the OLED at higher brightness considerably decreasing its life and increasing its power consumption. The increased power consumption is detrimental for battery-operated devices. Another disadvantage is that the emitted light that reaches the viewer is linearly polarized by the components of the circular polarizer. Thus, if the viewer is wearing polarized sunglasses, the display will be illegible at certain orientations. A further disadvantage is the processing difficulty of adhering the circular polarizer to the viewing surface of the OLED. Another disadvantage is that the circular polarizer, typically a polymeric film, mounted onto the viewing surface presents additional failure points in the overall OLED module, particularly under high heat and humidity conditions.

Another approach to improving contrast is the "black cathode" approach. This approach uses thin film interference effects at the cathode to eliminate ambient light reflections. In this approach, one or more additional layers is deposited during OLED fabrication behind the cathode layer. These one ore more additional layers are engineered to cause destructive interference of light at the cathode thus suppressing reflections. By controlling the thickness of the one or more additional layers, the phase shift of the light reflected by the one of those additional layers is such that it cancels the ambient light that is reflected (i.e., the light reflected by one of the additional layers and the reflected ambient light have almost equal amplitudes but are 180 degrees out of phase). The disadvantage of this approach is that in implementing it, the processing is difficult as the thicknesses of the one or more additional layers have to be exact in order to achieve the destructive interference and the processing of the OLED involves the deposition of additional layers.

In addition to the need for the cathode mentioned earlier, there also exists a need for an alternative to enhancing the contrast of the image produced by an OLED while not absorbing the light produced by it and while being easy to implement.

SUMMARY

A first embodiment of a substantially transparent and conductive electrode is described. This embodiment of the electrode includes a first layer and a second layer that is on the first layer. The first layer and the second layer are exposed to a medium and the second layer reacts with at least one of: (1) the first layer and (2) the medium to produce the substantially transparent and conductive electrode.

Another embodiment of the substantially transparent and conductive electrode is also described. This embodiment includes a first layer, a second layer on the first layer, and a third layer that is on the second layer. The first layer, the second layer, and the third layer are exposed to a medium and to produce the substantially transparent and conductive electrode any one of: (1) the second layer reacts with the third layer or (2) the second layer reacts with the medium and the third layer reacts with the medium.

An embodiment of a method to produce a substantially transparent and conductive electrode is also described. This embodiment of the method includes: (1) depositing a first layer, and (2) depositing a second layer on the first layer.

Here, the first layer and the second layer are exposed to a medium and the second layer reacts with at least one of: (1) the first layer, and (2) the medium to produce the substantially transparent and conductive electrode.

DETAILED DESCRIPTION

An embodiment of the present invention pertains to an electrode that is substantially transparent and conductive and that is incorporated within an organic electronic device. This electrode includes a first layer and a second layer that is on the first layer. The electrode optionally includes a third layer that is on the second layer. As used within the specification and the claims, the term "on" includes when layers are in physical contact and when layers are separated by one or more intervening layers. The first layer, the second layer, and the third layer are exposed to a medium and reactions between various combinations of the first layer, the second layer, the third layer and the medium produce the substantially transparent and conductive electrode.

Figure 1:
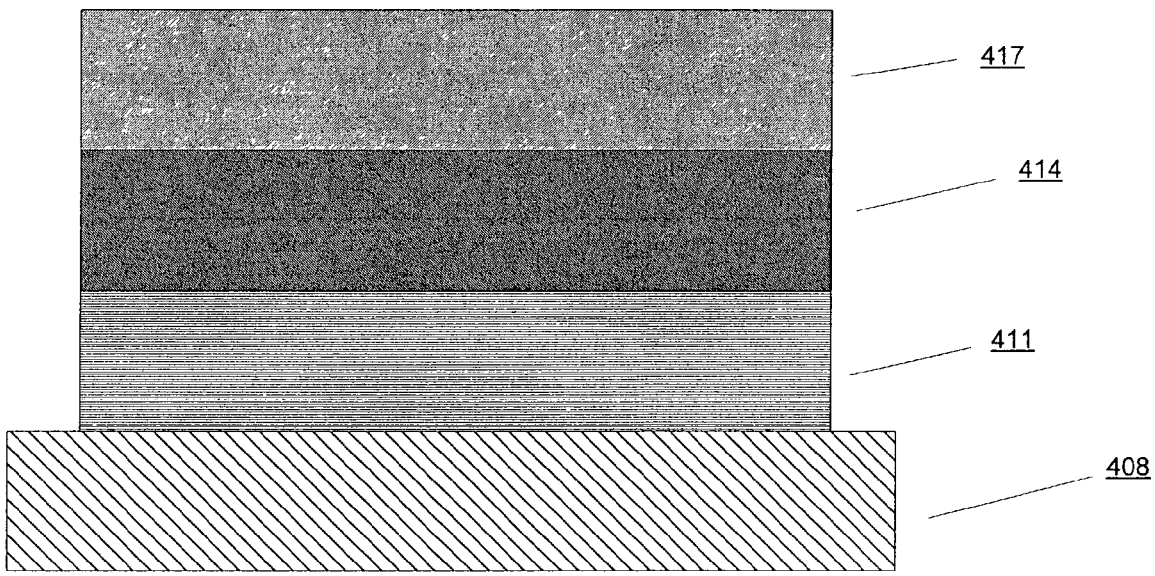
FIG. 1 shows an embodiment of an organic electronic device according to the present invention.

FIG. 1 shows an embodiment of an organic electronic device 405 according to the present invention. The organic electronic device 405 includes a substrate 408 and a first electrode 411 on the substrate 408. The first electrode 411 may be patterned for pixilated applications or unpatterned for backlight applications. If the organic electronic device 405 is a phototransistor, then the first electrode may be, for example, the source and drain contacts of that transistor. The organic electronic device 405 also includes one or more organic layers 414 on the first electrode 411. The organic electronic device 405 includes a second electrode 417 on the one or more organic layers 414. If the organic electronic device 405 is a phototransistor, then the second electrode may be, for example, the gate contact of that transistor. FIG. 1 shows the minimum number of layers for the organic electronic device 405. Other layers may also be added including insulating layers between the first electrode 411 and the one or more organic layers 414, and/or between the one or more organic layers 414 and the second electrode 417.

Figure 2:
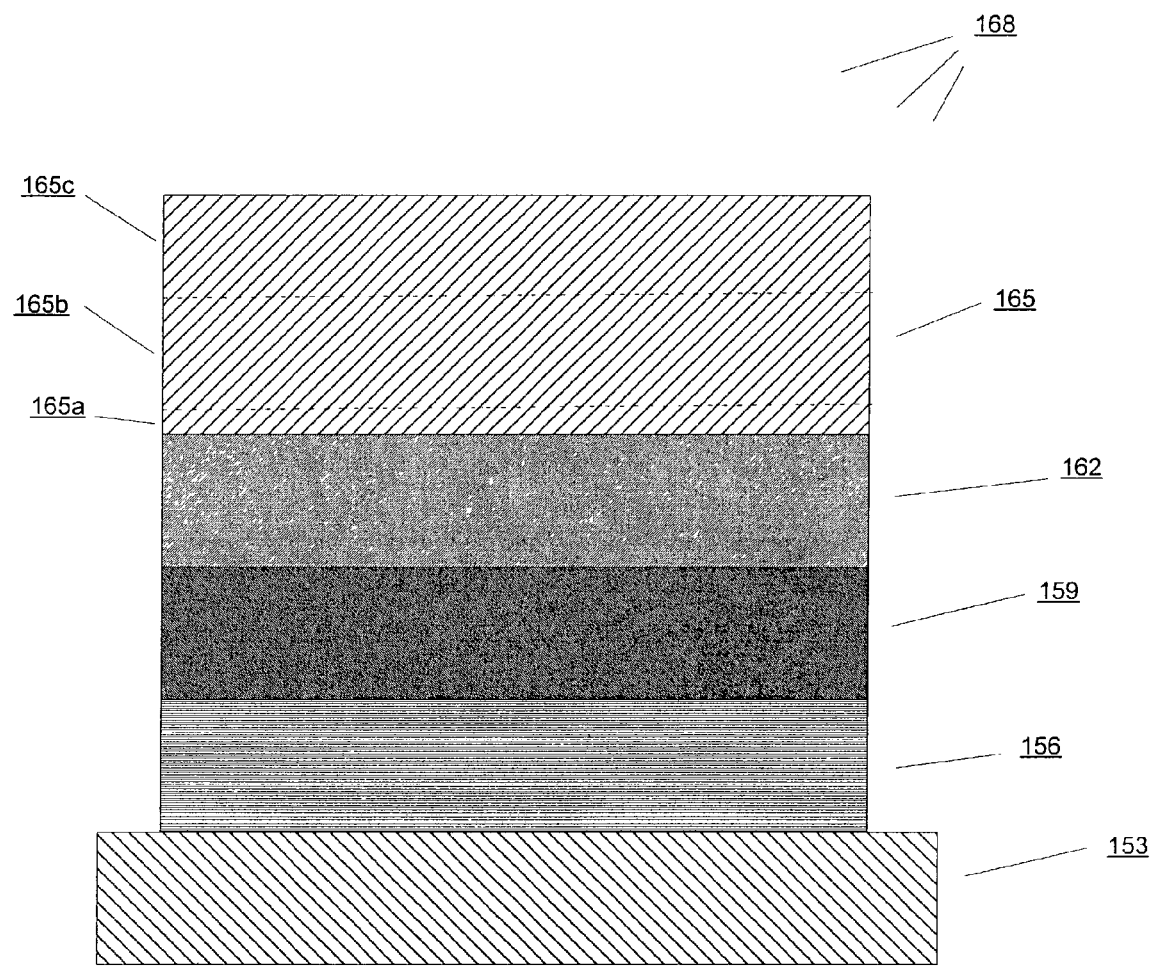
FIG. 2 shows a first embodiment of an OLED according to the present invention.

FIG. 2 shows an embodiment of an OLED 150 according to the present invention. The OLED 150 includes a substrate 153 that may be, for example, glass or plastic, and rigid or flexible. The OLED 150 also includes a first electrode such as an anode layer 156 that is deposited on the substrate 153. The anode layer 156 may be, for example, indium tin oxide ("ITO"). The OLED 150 also includes two organic layers: a conducting polymer layer 159 that is deposited on the anode layer 156, and an emissive polymer layer 162 that is deposited on the conducting polymer layer 159. The conducting polymer layer 159 assists in injecting and transporting holes. The emissive polymer layer 162 assists in injecting and transporting electrons. In this configuration, the emissive polymer layer 162 emits light. In another configuration, the conducting polymer layer 159 emits light, or another separate layer is deposited that emits light. The OLED 150 includes a second electrode that is a cathode layer 165 that is deposited on the emissive polymer layer 162. The cathode layer 165 includes a first layer (e.g., an electron injecting layer 165a), a second layer (e.g., a conductive layer 165b), and a medium 168.

The electron injecting layer 165a reduces the barrier to electron injection from the conductive second layer 165b to the semiconductive organic emissive polymer layer 162. The work function of the electron injecting layer 165a is closer to a lowest unoccupied molecular orbital of the emissive polymer layer 162 than a work function of the conductive layer 165b. By bringing the work function of the electron injecting layer 165a closer to the lowest unoccupied molecular orbital of the emissive polymer layer 162, the barrier to electron injection is reduced thus increasing the efficiency of the OLED 150. In one configuration, the electron injecting layer 165a is a low work function metal such as, for example, barium, calcium, magnesium, lithium or a mixture or alloy thereof. Preferably, the electron injecting layer 165a is comprised of a barium layer. In one configuration, the range of thickness of the electron injecting layer 165a is from about 0.1 nm to about 10 nm; preferably, is from about 0.5 nm to about 5 nm; more preferably, from about 1 nm to about 4 nm; and most preferably, about 3 nm.

In this embodiment, the conductive layer 165b provides the electrons to the electron injecting layer 165a that are injected to the emissive polymer layer 162. The conductive layer 165b is comprised of a metallic layer such as silver or aluminum, preferably, silver. The conductive layer 165b is thick enough so that a continuous conductive film results after reaction with the electron injecting layer 165a and/or the surrounding medium and not too thick that the conductive layer 165b doesn't react enough with the electron injecting layer 165a and/or the surrounding medium to become substantially transparent. In this embodiment, the range of thickness of the conductive layer 165b is from about 10 nm to about 10,000 nm; preferably is from about 5 nm to about 200 nm; more preferably, from about 20 nm to about 30 nm; and most preferably, about 25 nm.

In this embodiment, a third layer (e.g., a top layer 165c) is deposited on the conductive layer 165b. The top layer 165c promotes the making of the conductive layer 165b and/or the electron injecting layer 165a substantially transparent and decreases the path resistance for current conduction within the cathode. The top layer 165c reacts with the conductive layer 165b and/or the medium to become substantially transparent. In this embodiment, the top layer 165c is a reactive metal such as barium. The top layer 165c is thick enough to promote the reaction to produce the substantially transparent cathode and not too thick that the resulting cathode is not transparent. In this embodiment, the range of thickness of the top layer 165c is from about 5 nm to about 200 nm; preferably is from about 10 nm to about 100 nm; more preferably from about 20 nm to about 30 nm; and most preferably, about 25 nm. In one configuration of this embodiment, the top layer 165c is the same layer type as the electron injecting layer 165a, i.e., it is also comprised of barium. In another configuration, the top layer 165c is of a different layer type than the electron injecting layer 165a. In another embodiment, the top layer 165c is not present.

In this embodiment, the multiple layers of the cathode of the OLED 150 are deposited in a vacuum chamber which is inside a controlled environment such as a glove box. After deposition, OLEDs are placed in the glove box where they are in contact with the medium 168. In one configuration, the medium is comprised of a liquid or a gas such as argon, nitrogen, oxygen, moisture, residual solvent, or a mixture of these elements. The residual solvent is released from the one or more organic layers (e.g., PEDOT and PPV), and this residual solvent can react with the cathode layers to form the transparent and conductive cathode. In this configuration, the concentration of argon, nitrogen, oxygen, moisture, residual solvent, or a mixture of these elements is at least 0.1 ppm. More specifically, the medium is comprised of nitrogen or argon and 0.1–1 ppm oxygen and 0.1–1 ppm moisture.

In one configuration of this embodiment of the cathode, the first layer is thin enough to be substantially transparent and the second layer and the medium react together to make the second layer also substantially transparent. In a second configuration, the first layer reacts with the medium to make the first layer substantially transparent and the second layer reacts with the medium to make the second layer substantially transparent. In a third configuration, the first layer and the second layer react together to produce the substantially transparent and conductive electrode. In a fourth configuration, the first layer, the second layer, and the medium react together to produce the substantially transparent and conductive electrode. If the cathode includes a third layer, then in a fifth configuration, the second layer and the third layer react together to produce the substantially transparent and conductive electrode. In a sixth configuration, the second layer reacts with the medium, and the third layer reacts with the medium to produce the substantially transparent and conductive electrode. In a seventh configuration, the first layer, the second layer, and the third layer react together to produce the substantially transparent and conductive electrode. In an eighth configuration, the first layer, the second layer, the third layer, and the medium react together to produce the substantially transparent and conductive electrode.

One embodiment for creating the OLED 150 with the substantially transparent and conductive cathode includes depositing the anode layer 156 on the substrate 153. Next, the anode layer 156 is patterned to form strips of the anode layer 156. Then, one or more organic layers are deposited on the anode layer 156. In this embodiment, two organic layers are deposited: (1) the conducting polymer layer 159 is deposited on the anode layer 156 and (2) the emissive polymer layer 162 is deposited on the conducting polymer layer 159. In one configuration of this embodiment, the conducting polymer layer 159 and the emissive polymer layer 162 are comprised of polymers. The conducting polymer layer 159 can be, for example, polyaniline ("PANI") or polyethylenedioxythiophene ("PEDOT"). The emissive polymer layer 162 can be any light emitting material including polymers such as, for example, polyphenylenevinylene ("PPV"), PPV derivatives and copolymers and blends, polyfluorene ("PF"), PF derivates or copolymers or blends, or super yellow ("SY"), a commercially available light emitting polymer from Covion Organic Semiconductors GmbH. In another configuration, rather than being comprised of polymers, the organic layers are comprised of small molecules or oligomers. These organic layers can be deposited by, for example, spin coating, ink jet printing, screen printing, vacuum evaporation, sublimation, flexographic printing, and web coating. Next, the cathode layer 165 is deposited on the emissive polymer layer 162. Depositing the cathode layer 165 includes: (1) depositing the electron injecting layer 165a on the emissive polymer layer 162, (2) depositing the conductive layer 165b on the electron injecting layer 165a, and (3) depositing the top layer 165c on the conductive layer 165b. The cathode layers are vacuum deposited by, for example, physical vapor deposition. The OLED is formed using these depositions which are done in vacuum at a pressure of $10^{-6}$ to $10^{-7}$ torr. After deposition, the OLED 150 is stored in a controlled environment such as a glove box for some time until the cathode layer becomes substantially transparent but still conductive. Next, the OLED 150 with the cathode layer 165 that is substantially transparent and conductive is encapsulated to protect it from damaging environmental effects caused by, for example, continued excessive exposure to concentrations of oxygen and moisture.

Figure 3:
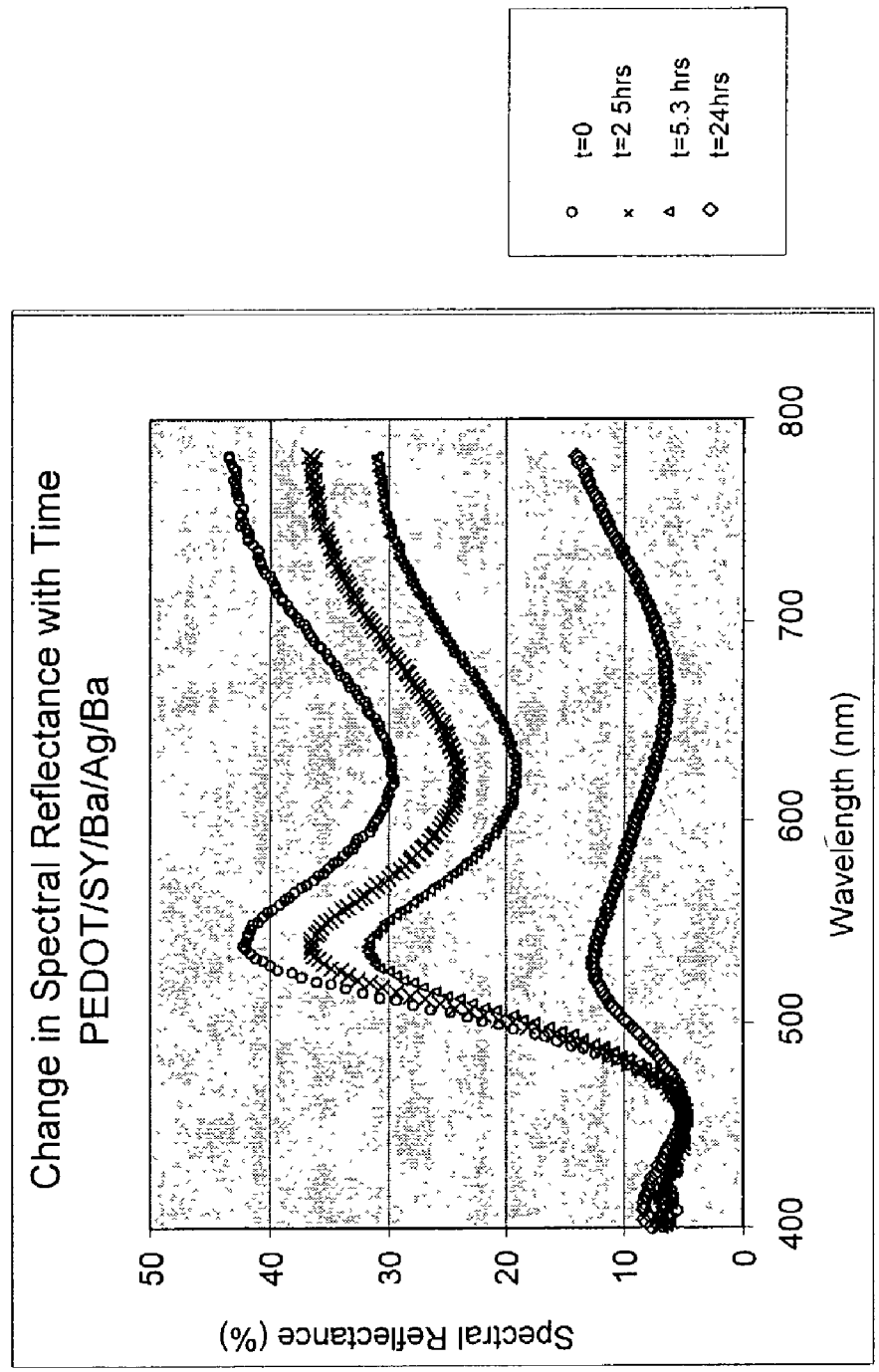
FIG. 3 shows the change in spectral reflectance given different storage times for an embodiment of a cathode layer according to the present invention.

FIG. 3 shows the change in spectral reflectance over time for different OLEDs that use the embodiment of the cathode layer 165 according to the present invention. To monitor the reaction of barium with silver and the amount of light reflected from the cathode, four OLEDs were prepared, each of the four OLEDs were comprised of PEDOT forte conducting polymer layer 159, PPV-based polymer for the emissive polymer layer 162, and the cathode layer 165 is comprised of a 3 nm thick barium layer, a 25 nm thick silver layer, and a 100 nm thick barium layer. The first OLED was removed from the evaporator within the glove box after the cathode layer was deposited and then immediately encapsulated. The glove box was operating at 0.1 ppm oxygen and 0.1 ppm moisture. In FIG. 3, the spectral reflectance of the first OLED is shown by the "t=0 hours" graph. The second OLED was stored in the glove box for 2.5 hours after the cathode layer was deposited and then encapsulated. In FIG. 3, the spectral reflectance of the second OLED is shown by the "t=2.5 hours" graph. The third OLED was stored in the glove box for 5.25 hours after the cathode layer was deposited and then encapsulated. In FIG. 3, the spectral reflectance of the third OLED is shown by the "t=5.25 hours" graph. The fourth OLED was stored in the glove box for 24 hours after the cathode layer was deposited and then encapsulated. In FIG. 3, the spectral reflectance of the fourth OLED is shown by the "t=24 hours" graph. During the time period in which the OLEDs were stored within the glove box, the barium layers reacted with the silver layer and the medium to form a cathode layer that became more transparent as the storage time within the glove box increased.

After the OLEDs which were stored in the glove box for different time periods were encapsulated, the spectral reflection of each OLED was measured. The diffused spectral reflection was measured wit respect to diffused white light standards. The OLEDs were placed in an integrating sphere and its surfaces were illuminated uniformly from all angles. Black electrical tape was applied to the back surface of each OLED to prevent the measurement of transmitted light. As FIG. 3 shows, the longer the OLED is stored in the glove box prior to encapsulation, the lower the percentage of light that is reflected from the cathode. For example, the top-most graph showing the spectral reflectance of the first OLED (i.e., t=0) illustrates that, for example, at 540 nm, the percentage of incoming light that is reflected by the cathode layer is approximately 42%. The bottom-most graph showing the spectral reflectance of the fourth OLED (i.e., t=24) illustrates that at 540 nm, the percentage of incoming light that is reflected by the cathode layer has significantly reduced to about 12%. Comparing these two graphs, by storing the OLED in the glove box for 24 hours after the cathode layer is deposited, the percentage of spectral reflectance is reduced by about two-thirds. As shown by the bottom-most graph (t=24 hours), after storing the OLED in the glove box for 24 hours after the cathode layer is deposited, the cathode layer is substantially transparent and the percentage of light reflected by the cathode layer is less than 15 percent.

Figure 4:
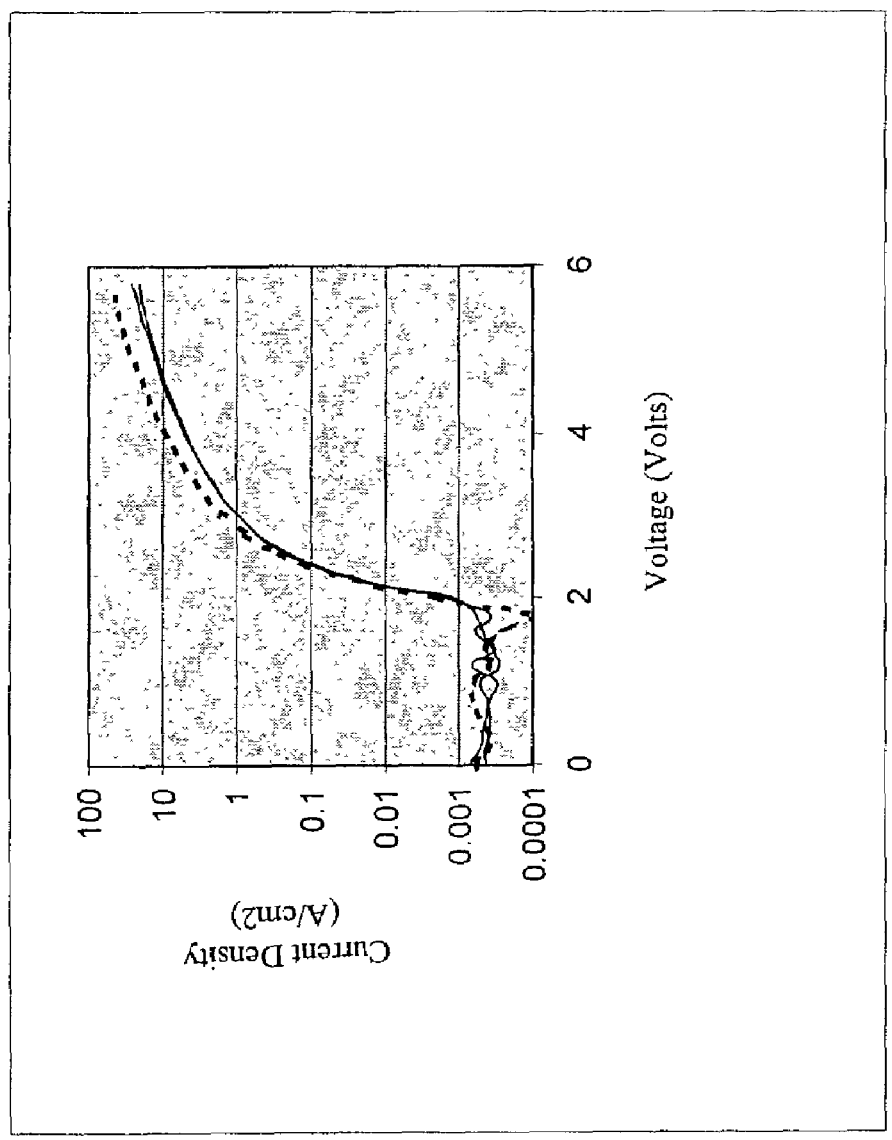
FIG. 4 shows the current density versus voltage at different storage times for the embodiment of the cathode layer according to the present invention.

FIG. 4 shows the current density versus voltage of different OLEDs that use the embodiment of the cathode layer according to the present invention. In FIG. 4, the current density versus voltage of the first OLED is shown by the "t=0 hours" graph, the current density versus voltage of the second OLED is shown by the "t=2.5 hours" graph, and the current density versus voltage of the third OLED is shown by the "t=5.25 hours" graph. As illustrated in FIG. 4, the current-voltage characteristics of the OLEDs are not significantly changed by the reaction of the one or more cathode layers and the medium to produce the substantially transparent cathode. In other words, the cathode of the present invention remains substantially conductive and capable of efficient electron injection even after becoming transparent.

Figure 5:
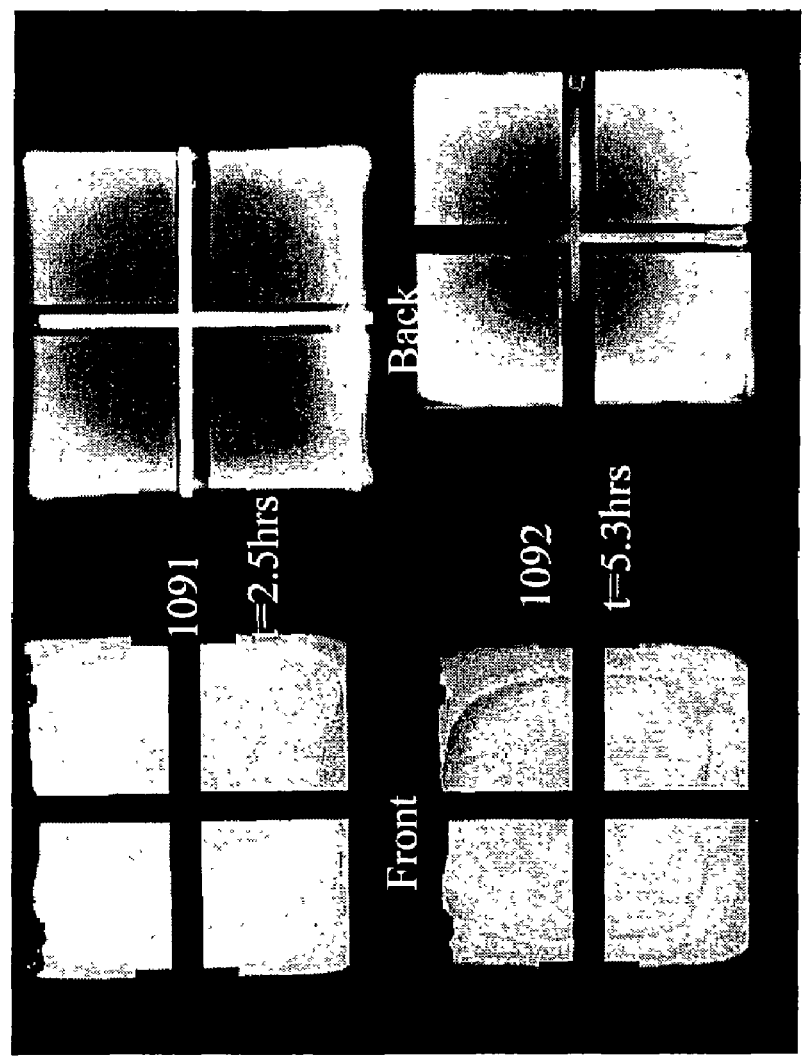
FIG. 5 shows time-lapse photography of two OLEDs formed according to the embodiment of the present invention after storage in a glove box for different time periods.

FIG. 5 shows time-lapse photography of two OLEDs formed according to the embodiment of the present invention after storage in a glove box for different time periods. FIG. 5 shows the light emitted from the front and back of an OLED after storage in the glove box for 2.5 hours (the top OLED) and the front and back of another OLED after storage in the glove box for 5.3 hours (the bottom OLED). As FIG. 5 shows, more light is transmitted through the back of the OLED (i.e., the cathode layer) after 5.3 hours than after 2.5 hours. In general, the longer the time period that the barium layer, the silver layer, and/or the medium have to react in the controlled environment, the lower the reflection produced at the cathode layer.

Figure 6:
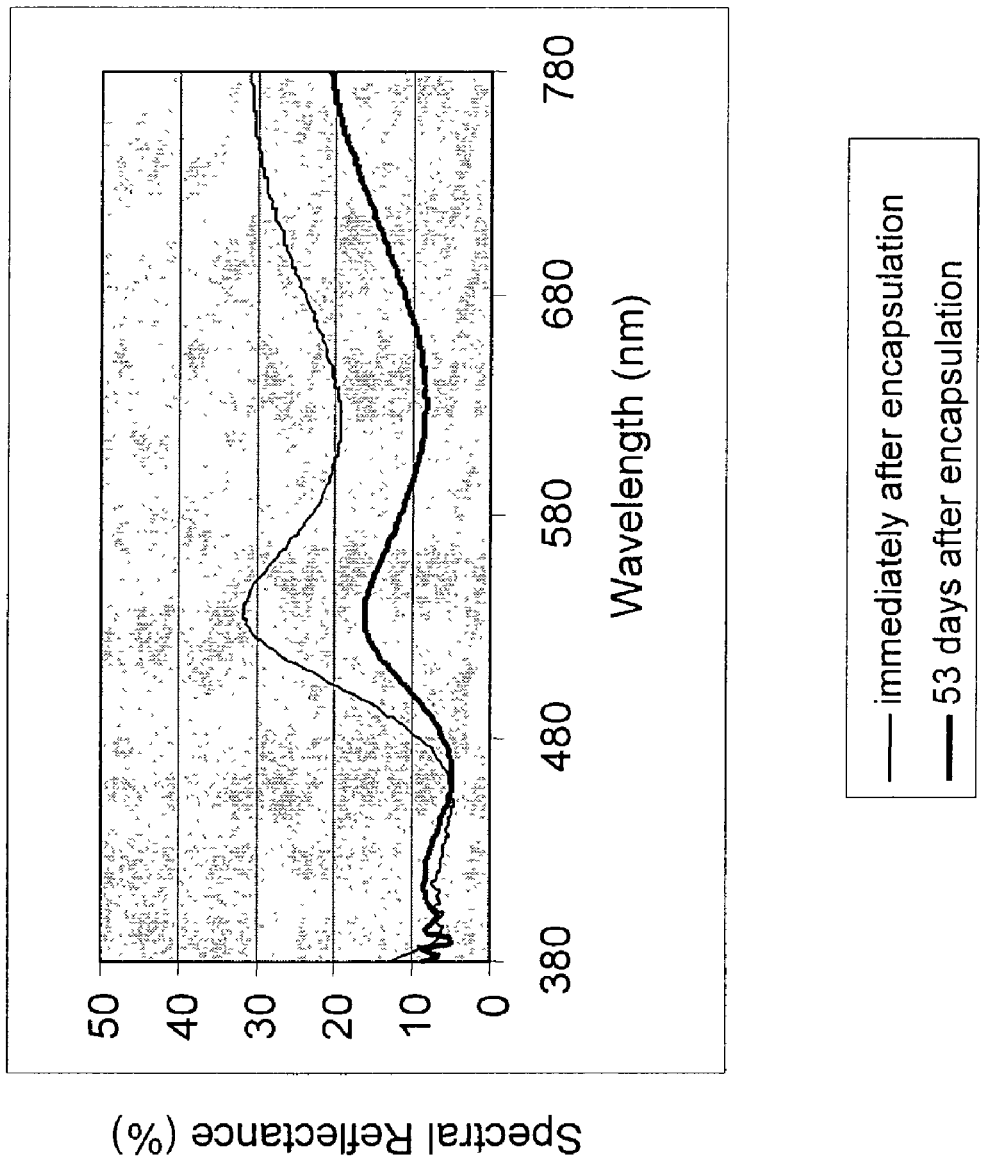
FIG. 6 shows the change in spectral reflectance given different storage times after encapsulation for the embodiment of the OLED according to the present invention.

FIG. 6 shows the change in spectral reflectance at the cathode given different storage times after encapsulation for the embodiment of the OLED according to the present invention. Here, the OLEDs were stored in the glove box for 5.25 hours after the cathode layer was deposited and then encapsulated inside the glove box. As FIG. 6 shows, the barium layer continued to react with the silver layer even after encapsulation. For example, at the peak of the graphs which is about 540 nm, the percentage reflectance is reduced from about 31% immediately after encapsulation to about 16% fifty-three days after encapsulation.

Figure 7:
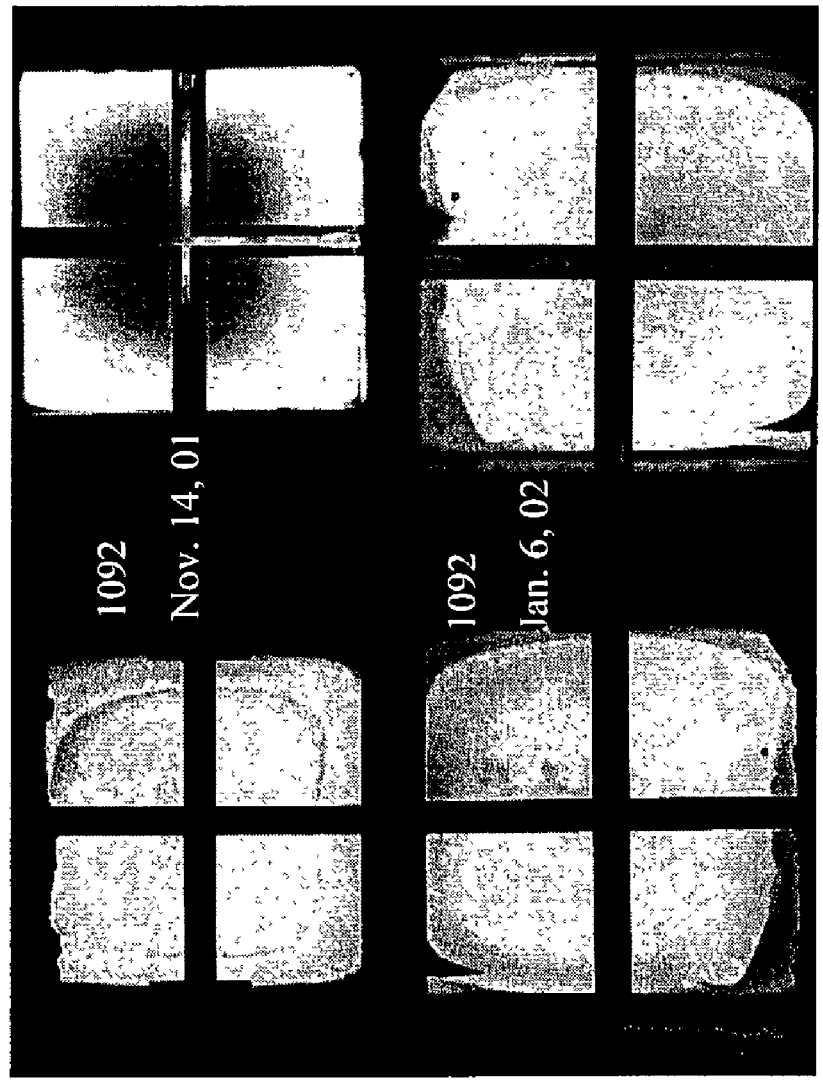
FIG. 7 shows time-lapse photography of two OLEDs formed according to the embodiment of the present invention for different time periods after encapsulation.

FIG. 7 shows time-lapse photography of two OLEDs formed according to the embodiment of the present invention after encapsulation for different time periods. FIG. 7 shows the front and back of an OLED after storage in the glove box for 5.25 hours and then immediately encapsulated (the top OLED dated Nov. 14, 2001) and the front and back of the same OLED fifty three days after encapsulation. As FIG. 7 shows, more light is transmitted through the back of the OLED (i.e., the cathode layer) fifty three days after encapsulation. FIG. 6 and FIG. 7 show that the barium layer reacts with the silver layer even after encapsulation to reduce reflection at the cathode layer. As these figures show, the barium layer and the silver layer do not have to be stored in the glove box for them to react with each other to form the substantially transparent and conducting cathode layer.

Figure 8:
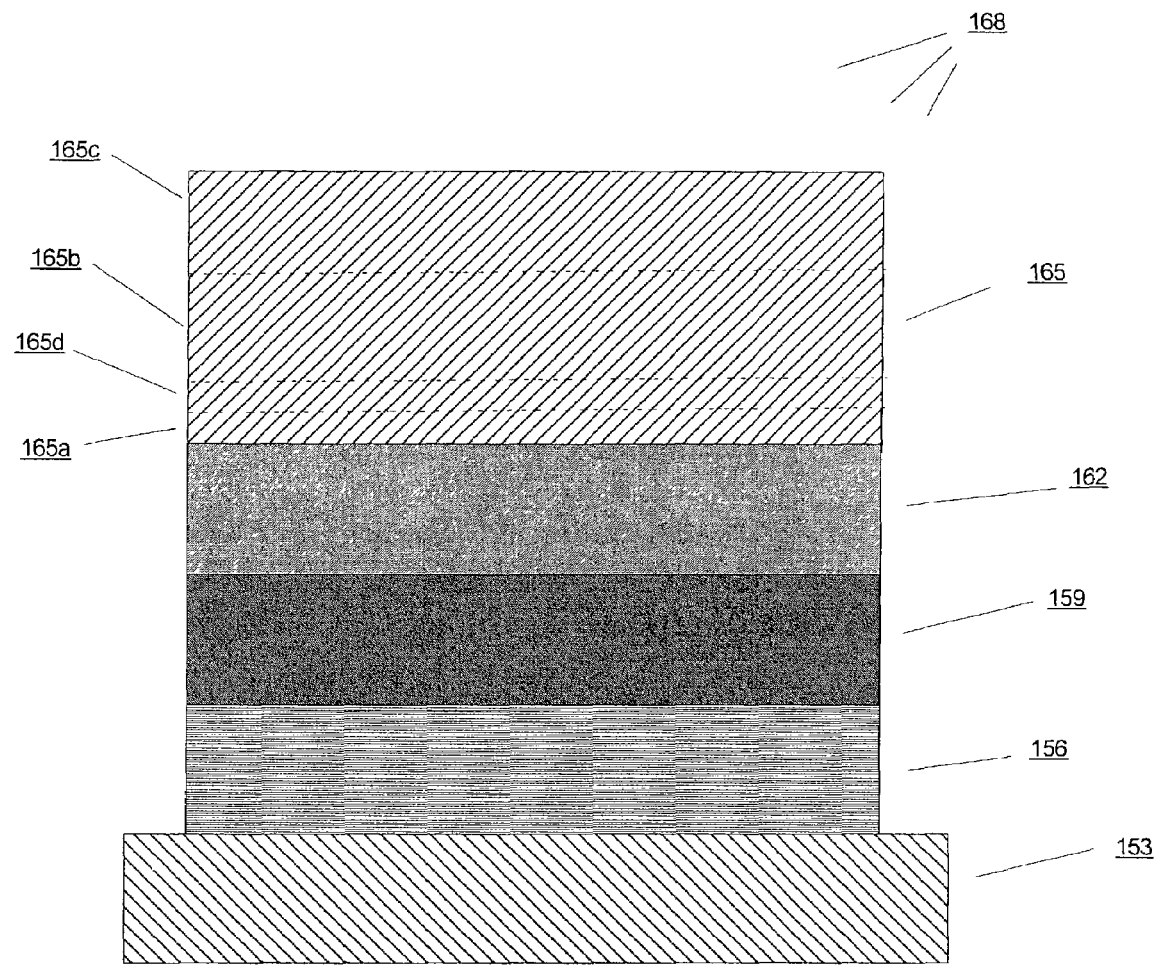
FIG. 8 shows a second embodiment of an OLED according to the present invention.

FIG. 8 shows a second embodiment of an OLED 177 according to the present invention. In FIG 8, a barrier layer 165d is deposited on the electron injecting layer 165a and the conductive layer 165b is deposited on the barrier layer 165d. The barrier layer 165d minimizes or eliminates reaction between the electron injecting layer and the conductive layer. Reaction between the electron injecting layer and the conductive layer may reduce charge injection from the conductive layer to the emissive polymer layer thus adversely affecting luminance and efficiency of the OLED. In one configuration, the barrier layer 165d is comprised of a conductive layer such as a gold layer or an aluminum layer. The barrier layer 165d is thick enough to minimize or eliminate reaction between the electron injecting layer and the conductive layer but not too thick that it not substantially transparent. In this embodiment, the thickness of the barrier layer 165d varies from about 0.1 nm to about 20 nm and preferably is from about 1 to about 5 nm.

Figure 9:
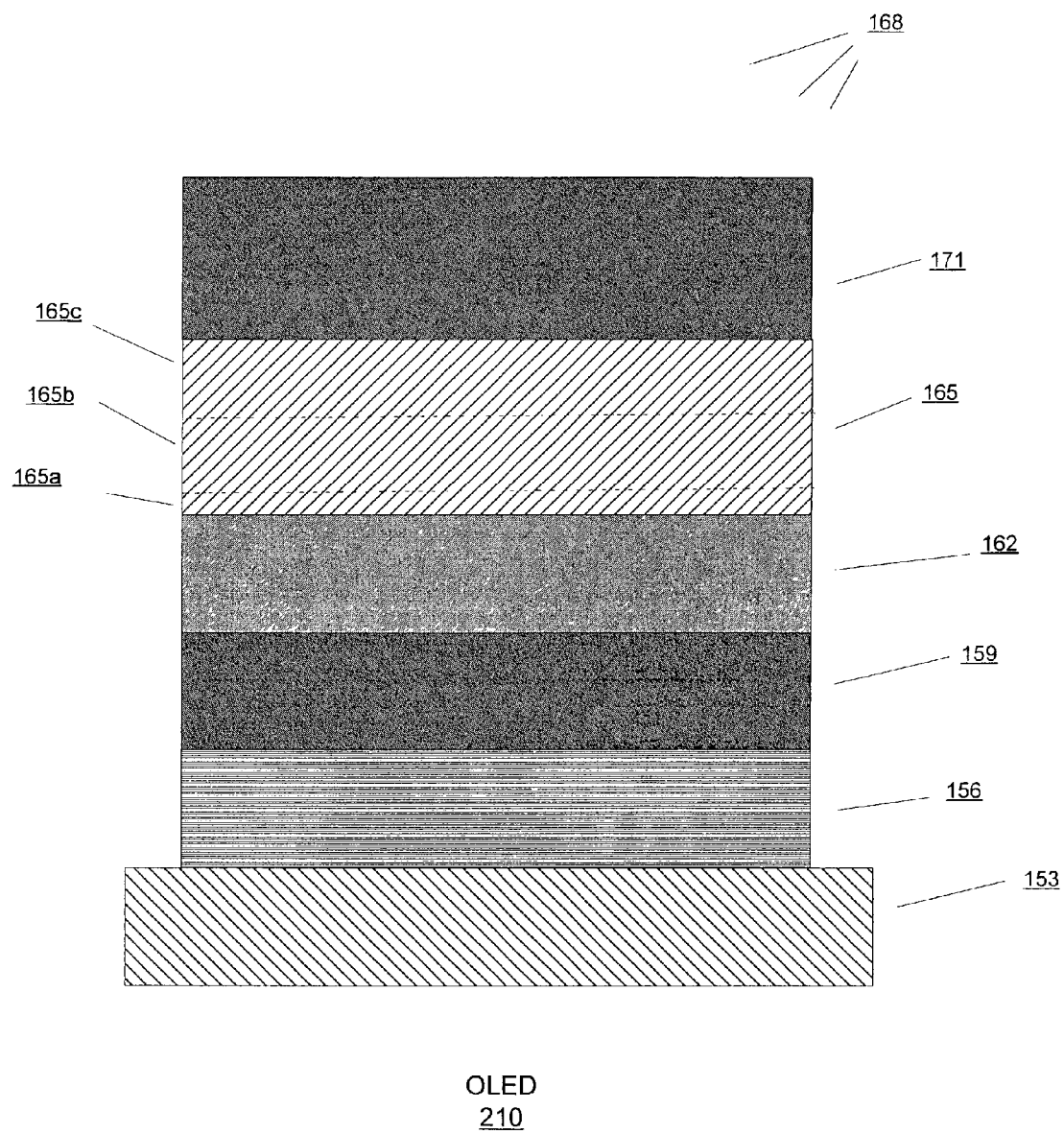
FIG. 9 shows a third embodiment of an OLED according to the present invention.

FIG. 9 shows a third embodiment of an OLED 210 according to the present invention. In this embodiment, a capping layer 171 is vacuum-deposited onto a top electrode such as the cathode layer 165 to improve, for example, the conductivity and lifetime of the OLED 210. The capping layer 171 provides higher luminance and efficiency due in part to the light reflection from the capping layer and also the higher current injection into the emissive polymer layer 162. In this embodiment, the capping layer 171 is comprised of a metal such as, for example, aluminum, silver, magnesium, or an alloy thereof. In other embodiments, the capping layer 171 is comprised of a transparent and conductive material such as ITO, zinc oxide, tin oxide, and zinc sulfide that is deposited by sputtering techniques. The capping layer 171 may also be comprised of black light absorbing conductive organic or inorganic materials. The range of thickness for the capping layer 171 is from about 50 nm to about 10,000 nm; preferably is from about 100 nm to about 500 nm; and more preferably, about 200 nm.

Six OLEDs were constructed where a PEDOT layer with a thickness of 115 nm comprises the conducting polymer layer, a super yellow layer with a thickness of 73 nm comprises the emissive polymer layer, and the cathode layer is comprised of: a barium layer with a thickness of 3 nm, a silver layer with a thickness of 25 nm, and a barium layer with a thickness of 25 nm. These OLEDs were stored in a glove box under 0.1 ppm moisture and 0.1 ppm oxygen for one hour. All devices emitted uniform light from the front (e.g., the anode side) as well as the back (e.g., the cathode side) of the OLEDs (i.e., the cathode is substantially transparent). Three of the six OLEDs were further capped after storage for one hour with an aluminum layer with a thickness of 200 nm. All devices were encapsulated inside the glove box.

Figure 10:
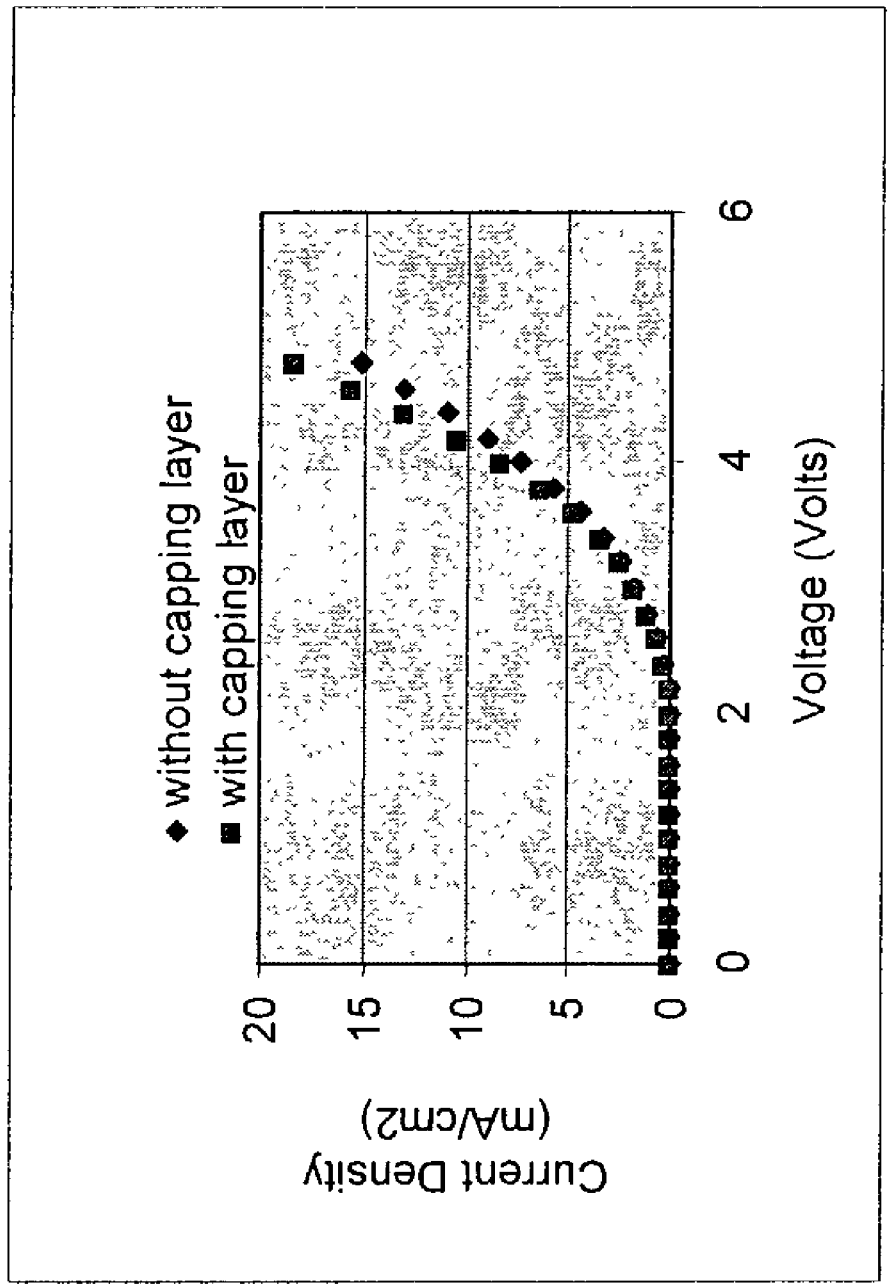
FIG. 10 shows the current density versus voltage graph for the displays with and without the capping aluminum layer.

FIG. 10 shows the average current density versus voltage graph for the OLEDs with and without the capping aluminum layer. As illustrated in FIG. 10, the current density in the OLEDs without the capping layer is only slightly lower than the current density in the OLEDs with the capping layer. This indicates that the above cathode after becoming transparent has still kept its conductivity. The higher current density of the OLEDs with the capping aluminum layer is due to the decreased path resistance for current conduction into the device.

Figure 11:
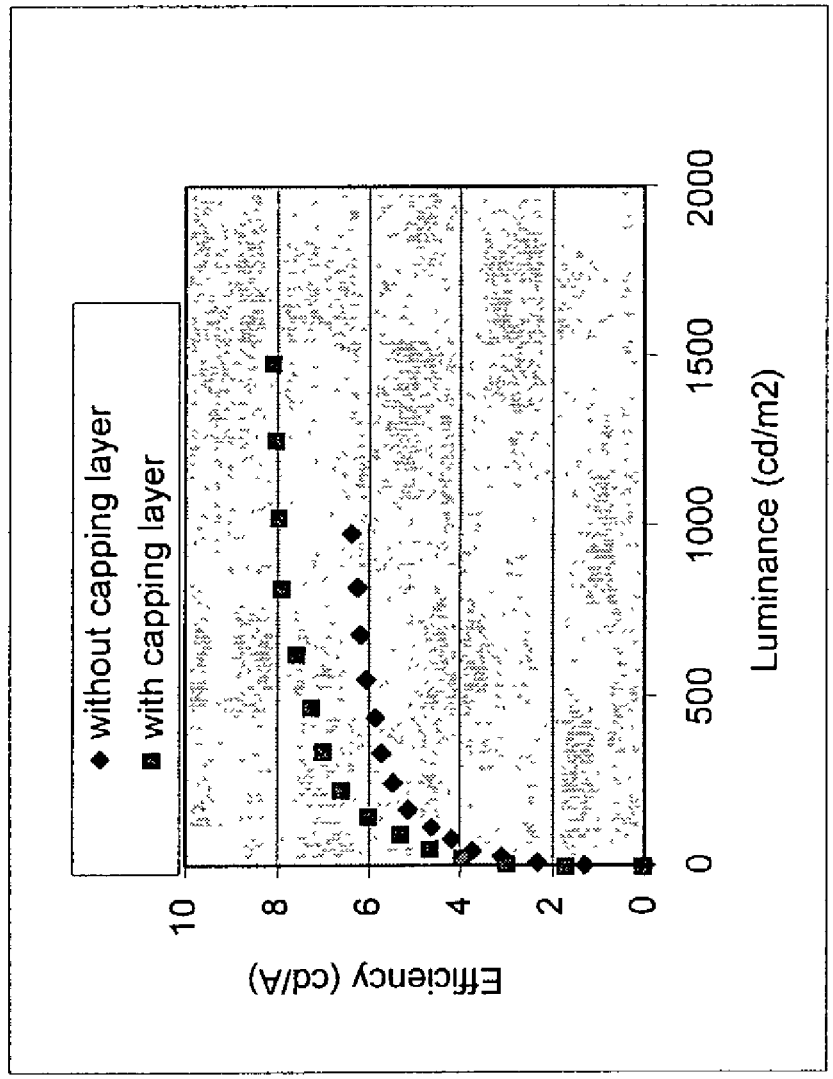
FIG. 11 shows the efficiency versus luminance graph for the displays with and without the capping aluminum layer.

FIG. 11 shows the efficiency versus luminance graph for the OLEDs with and without the capping aluminum layer. As illustrated in FIG. 11, the OLEDs without the capping aluminum layer have a high luminous efficiency of about 6.6 cd/A at 1,000 cd/m2 making it suitable for practical applications such as the transparent cathode. As also shown in FIG. 11, the OLEDs with the capping layer are more efficient than the OLEDs without the capping layer. The higher efficiency of the OLEDs with the capping layer is due to the light reflected from the aluminum capping layer and also due to the decrease in path resistance to the current conduction as discussed earlier. In this embodiment, the capping layer is comprised of aluminum. In another embodiment, the capping layer is comprised of a conductive and transparent material such as ITO.

Figure 12:
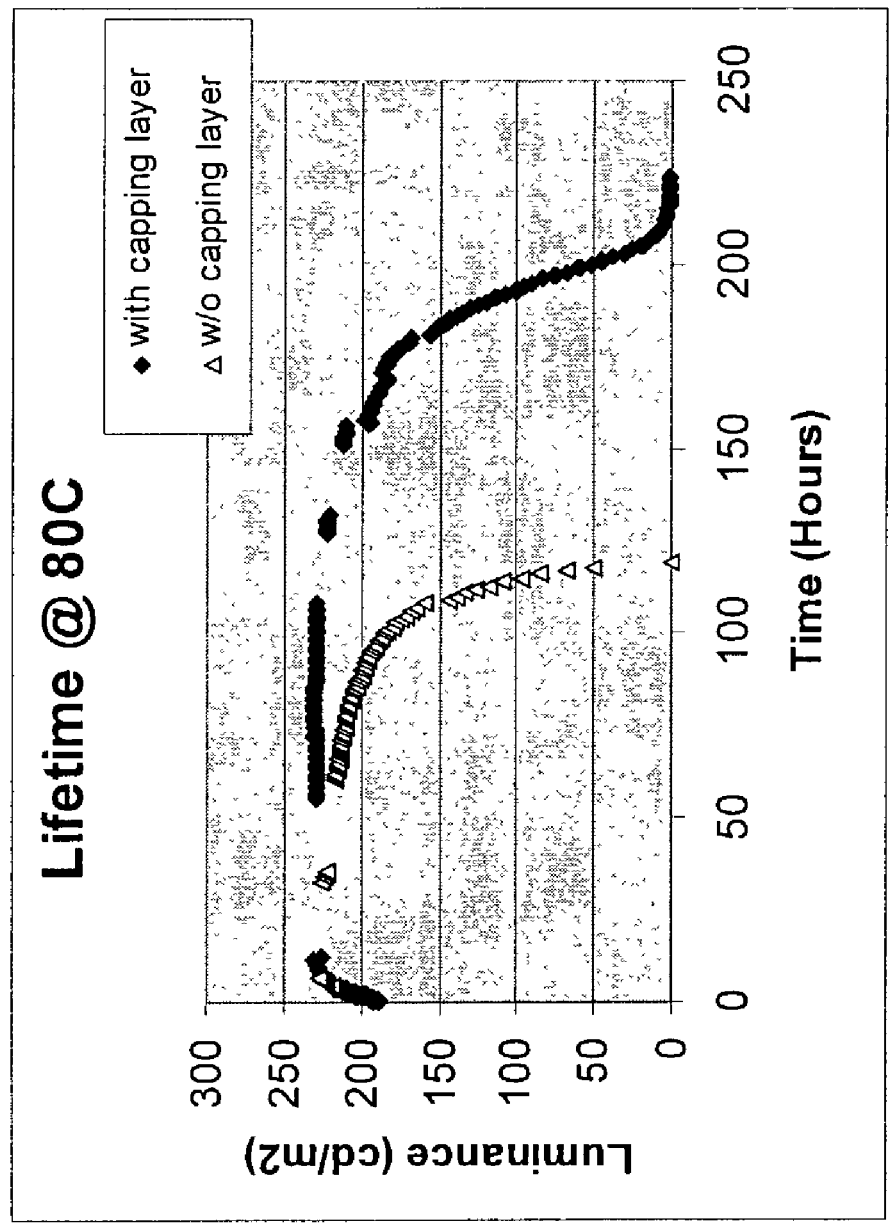
FIG. 12 shows the half-life for the displays with and without the capping aluminum layer.

FIG. 12 shows the half-life for the OLEDs with and without the capping aluminum layer. The half-life is the time it takes the initial luminance to decrease by one-half. As FIG. 12 shows, the OLEDs without the capping aluminum layer have a half-life of 100 hours at 80° C. corresponding to about 5000 hours of luminance at room temperature. As this figure shows, by incorporating the capping layer, the half-life of the OLEDs increases to about 200 hours at 80° C. corresponding to about 10,000 hours of luminance at room temperature. By using the capping layer, the half-life of the three OLEDs is increased due partly to the capping layer decreasing the path resistance to charge injection and due partly to preventing degradation of the electron injecting layer by, for example, exposure to moisture. The purpose of the above example is to illustrate that the long half-life of the OLEDs with the transparent cathode of the present invention can be further increased by depositing a capping layer onto the cathode. To prove this, a conductive but non-transparent material (aluminum) was used as the capping layer. In practice, one may use a conductive and transparent material such as ITO as the capping layer.

Figure 13:
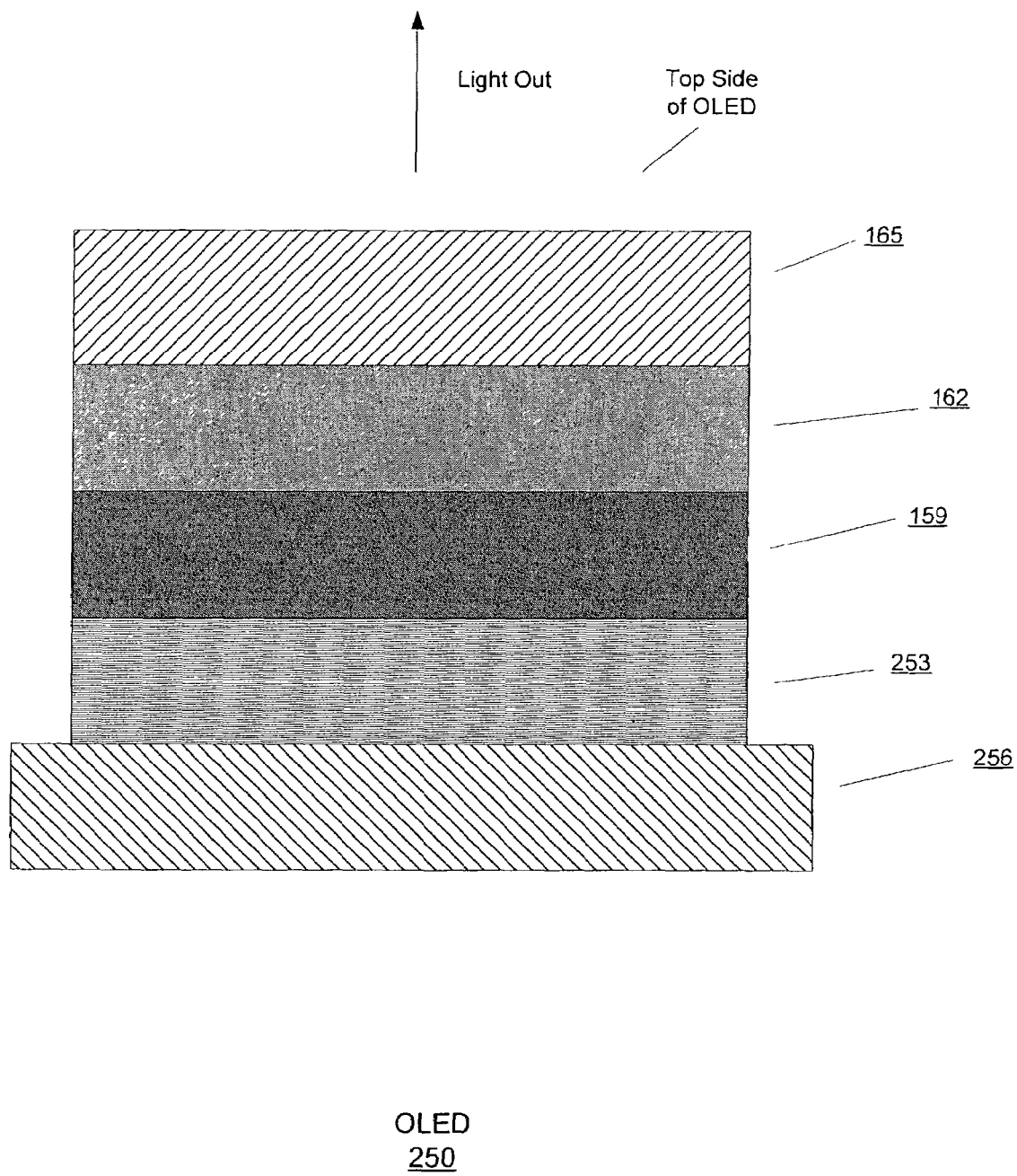
FIG. 13 shows an embodiment of a top-emitting OLED 250 according to the present invention.

FIG. 13 shows an embodiment of a top-emitting OLED 250 according to the present invention. In the top-emitting OLED, light is emitted only from the top side of the OLED. The top-emitting OLED 250 includes an anode layer 253 deposited on a substrate 256, a conducting polymer layer 159 deposited on the anode layer 253, an emissive polymer layer 162 deposited on the conducting polymer layer 159, and a cathode layer 165 deposited on the emissive polymer layer 162. In this embodiment, in order for light to emit only from the top side of the OLED 250, the cathode layer 165 is substantially transparent, but the anode layer 253, the substrate 256, or both are reflective. In another embodiment of the top-emitting OLED, the cathode layer, rather than the anode layer, is deposited on the substrate. The emissive polymer layer is deposited on the cathode layer and the conducting polymer layer is deposited on the emissive polymer layer. The anode layer is deposited on the conducting polymer layer. In this other embodiment, in order for light to emit only from the top side of the OLED, the anode layer and the cathode layer are substantially transparent, but the substrate is substantially absorbing.

Figure 14:
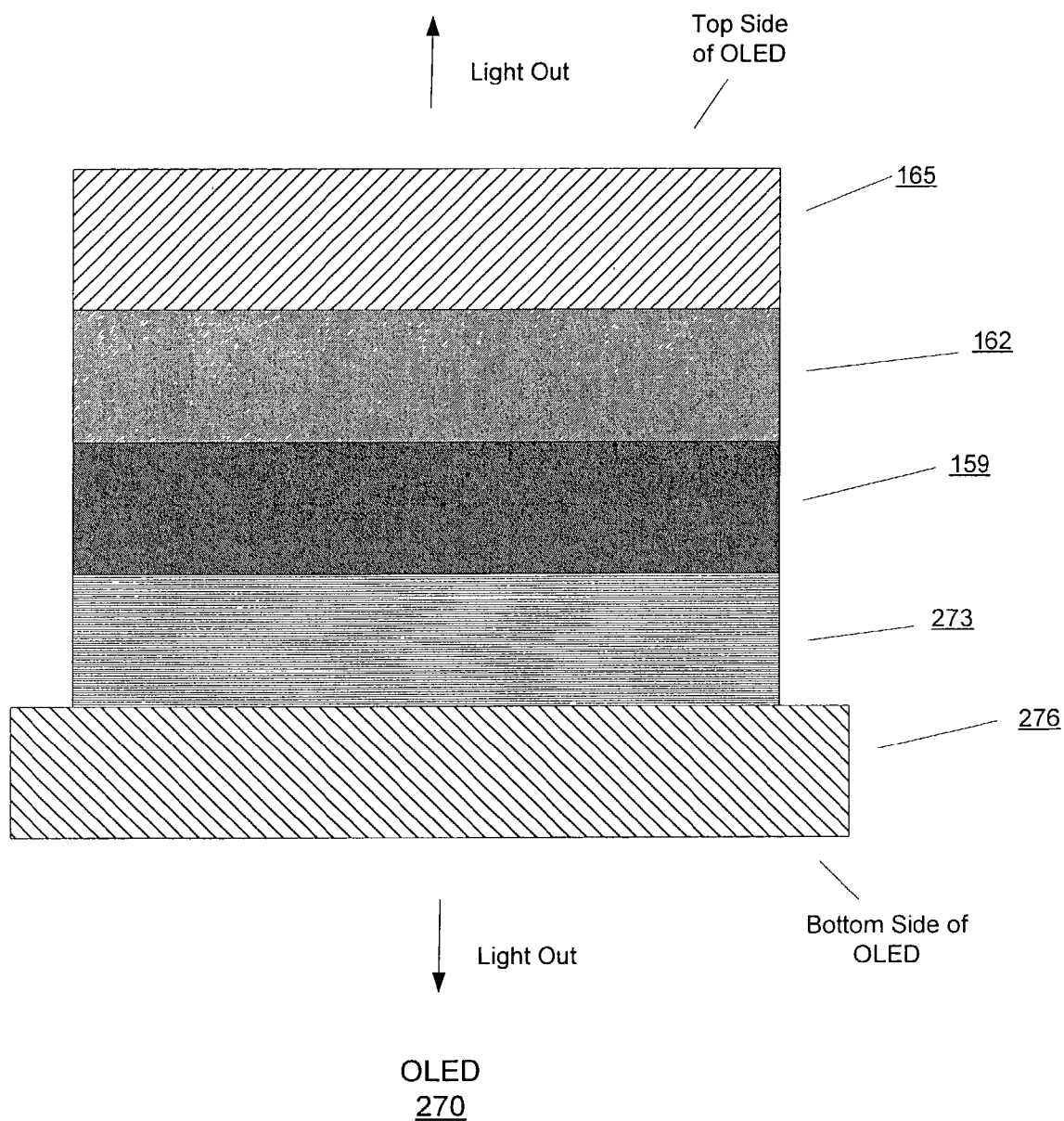
FIG. 14 shows an embodiment of a top and bottom emitting OLED 270 according to the present invention.

FIG. 14 shows an embodiment of a top and bottom emitting OLED 270 according to the present invention. In the top and bottom emitting OLED 270, light is emitted from both the top side and the bottom side of that OLED. In this embodiment, the cathode layer 165, the anode layer 273, and the substrate 276 are substantially transparent so that light can be emitted from both the top side and the bottom side of the OLED.

The embodiment of the substantially transparent and conductive cathode according to the present invention can be incorporated within an OLED display to improve the contrast of the image generated by it. Within the OLED display are transparent OLEDs where each of the transparent OLEDs includes the embodiment of the substantially transparent and conductive cathode, an anode layer that is substantially transparent, and a substrate that is also substantially transparent. A low-reflectance absorber is placed behind the transparent cathode. The low-reflectance absorber acts to absorb the ambient light that passes through its substantially transparent anode thus improving the contrast of the image generated by the transparent OLED. The efficiency in removing the reflected light using the transparent OLED and the low-reflectance absorber is generally close to one hundred percent.

Figure 15:
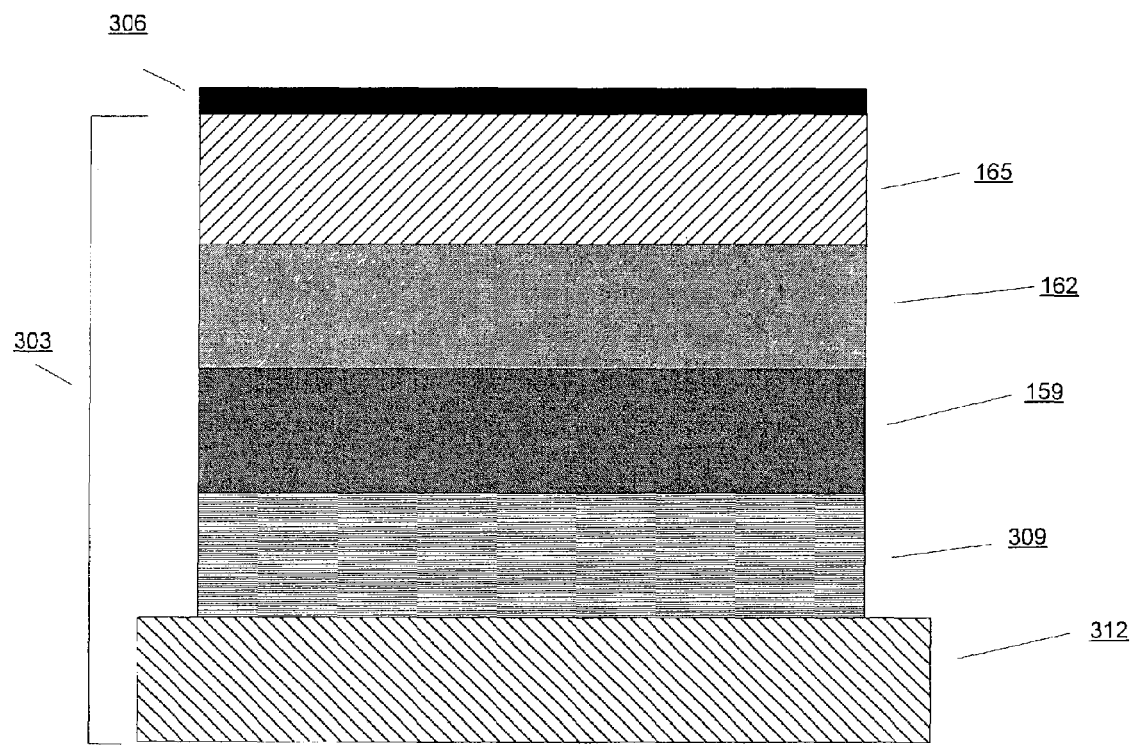
FIG. 15 shows an embodiment of a transparent OLED display 300 according to the present invention.

FIG. 15 shows an embodiment of a transparent OLED display 300 according to the present invention. In FIG. 15, a transparent OLED 303 includes the cathode layer 165, an anode layer 309, and a substrate 312 that are all substantially transparent. A low-reflectance absorber 306 is placed on the transparent OLED 303 on the cathode-side. The low-reflectance absorber 306 is comprised of a light absorbing coating such as, for example, a piece of black foam, or a layer of paper or cardboard painted or printed black at least on the side facing the cathode layer 165. In another configuration, the low-reflectance absorber in not a "black absorber" but rather uses a color different from that of the color emitted by the transparent OLED 303. For example, a dark green absorber behind a red-emitting transparent OLED is used to provide a high color contrast transparent OLED display. The low-reflectance absorber 306 can be polymeric and spin coated or sprayed onto the cathode. The low-reflectance absorber can also be a colored absorber that absorbs a part of the light-spectrum emitted from the transparent OLED.

Figure 16:
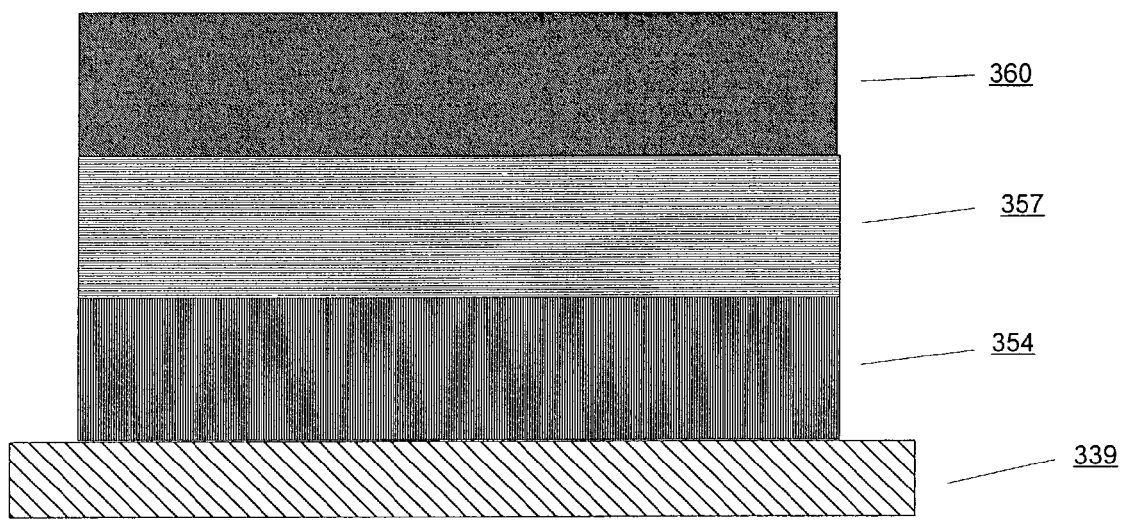
FIG. 16 shows an embodiment of a stacked OLED 330 according to the present invention.

Another application of the embodiment of the substantially transparent and conductive cathode according to the present invention is to arrange the transparent OLEDs in close proximity to each other. For example, the transparent OLEDs can be arranged in a stack to form a stacked OLED. As an example of stacked OLEDs, in color displays, two or three transparent OLEDs are arranged in a stack, each emitting one of the primary colors blue, green, or red thereby forming a color pixel from which various colors can be emitted. FIG. 16 shows an embodiment of a stacked OLED 330 according to the present invention. An OLED 354 is deposited on a substrate 339. An OLED 357 is deposited on the OLED 354. An OLED 360 is deposited on the OLED 357. The OLEDs 354, 357, and 360 are substantially transparent and one or more of these OLEDs employs one of the embodiments of the transparent cathode described earlier. In one configuration, an anode and a cathode of the OLED 354 are coupled either to a positive voltage or a negative voltage. In this configuration, the OLED 354 emits blue light when a forward bias voltage is applied between its anode and cathode. The brightness of the blue light emitted by the OLED 354 is a function of the voltage applied between its anode and cathode. Similarly, an anode and a cathode of the OLED 357 are coupled either to a positive voltage or a negative voltage. The OLED 357 emits green light when a forward bias voltage is applied between its anode and cathode. The brightness of the green light emitted by the OLED 357 is a function of the voltage applied between its anode and cathode. An anode and a cathode of the OLED 360 are coupled either to a positive voltage or a negative voltage. The OLED 360 emits red light when a forward bias voltage is applied between its anode and cathode. The brightness of the red light emitted by the OLED 360 is a function of the voltage applied between its anode and cathode. By varying the brightness of the light emitted by the OLED 354, the OLED 357, and the OLED 360, various colors can be emitted by the color pixel created by the stacked OLED 330. In other configurations, more or less than three OLEDs can be used in the stacked OLED. Also, the OLEDs 354, 357, and 360 emit colors different than the colors blue, green, and red respectively.

One or more barrier layers can be used to protect the OLED from atmospheric contamination such as, for example, the degradation of the organic layers at higher operating temperatures and/or humidity. One of the embodiments of the barrier layer described in the U.S. patent application entitled "Active Electronic Devices" by Reza Stegamat filed on Sep. 11, 2002 and having the application Ser. No. 10/242,656 is deposited on one of the embodiments of the substantially transparent and conductive cathode layer in order to, for example, protect it from atmospheric contamination.

While the embodiments of the substantially transparent and conductive cathode of the present invention are illustrated in which it is primarily incorporated within an OLED, almost any type of organic electronic device having a cathode may include these embodiments. In particular, embodiments of the substantially transparent and conductive cathode of the present invention may also be included in a solar cell, a phototransistor, a laser, a photodetector, or an opto-coupler. The OLED, the top emitting OLED, the top and bottom emitting OLED, the transparent OLED with the low-reflectance absorber, the stacked OLED, and the OLED with the transparent barrier layer all described earlier can be used within displays in applications such as, for example, computer displays, information displays in vehicles, television monitors, telephones, printers, and illuminated signs.

As any person of ordinary skill in the art of light-emitting device fabrication will recognize from the description, figures, and examples that modifications and changes can be made to the embodiments of the invention without departing from the scope of the invention defined by the following claims.

What is claimed:

1. A substantially transparent and conductive cathode, comprising;
    a first layer;
    a barrier layer on the first layer;
    a second layer on the barrier layer; and
    a third layer on the second layer,
    wherein the third layer is comprised of an alkaline earth metal,
    wherein the substantially transparent and conductive cathode is produced by exposing the first layer, the second layer, and the third layer to a medium, wherein any one of: (1) the second layer reacts with the third layer; (2) the second layer reacts with the medium, and the third layer also reacts with the medium; (3) the first layer, the second layer, and the third layer react together; or (4) the first layer, the second layer, the third layer, and the medium react together.

2. The cathode of claim 1 wherein the barrier layer minimizes the reaction between the first layer and at least one of: (1) the second layer and (2) the third layer.

3. The cathode of claim 1 further comprising a capping layer deposited on the cathode.

4. The cathode of claim 1 wherein a low-reflectance absorber is on the cathode.

5. An organic electronic device comprising the cathode of claim 1.

6. A method to produce a substantially transparent and conductive cathode, comprising:
    depositing a first layer;
    depositing a second layer on the first layer; and
    exposing the first layer and the second layer to a medium, wherein the substantially transparent and conductive cathode is produced by any one of: (1) the second layer reacting with the medium; (2) the first layer reacting with the medium and the second layer also reacting with the medium; (3) the first layer reacting wit the second layer; and (4) the first layer, the second layer, and the medium reacting together,
    wherein the first layer is comprised of barium, calcium, magnesium, lithium, or a mixture thereof, and the second layer is comprised of silver or aluminum.

7. The method of claim 6 further comprising prior to depositing the first layer, depositing a barrier layer on the first layer.

8. The method of claim 6 further comprising upon depositing the second layer, depositing a third layer on the second layer.

9. The method of claim 8 wherein the third layer is comprised of a reactive metal.

10. The method of claim 6 wherein
    the first layer is comprised of a barium layer that has a thickness from about 1 nm to about 4 nm thick;
    the second layer is comprised of a silver layer that has a thickness from about 20 nm to about 30 nm; and
    the medium is comprised of at least one of argon, nitrogen, oxygen, moisture, residual solvent, and a mixture thereof.

11. The method of claim 6 wherein the medium is at least one of a gas and a liquid.

12. The method of claim 6 wherein the medium is comprised of at least one of argon, nitrogen, oxygen, moisture, residual solvent, and a mixture thereof.

13. The method of claim 6 wherein the transparency of the cathode is greater than sixty percent.

14. The method of claim 6 further comprising depositing a capping layer on the cathode.

15. The method of claim 6 wherein the capping layer is comprised of an electrically conductive material.

16. The method of claim 6 wherein the capping layer is comprised of a conductive and transparent material.

17. A method to produce a substantially transparent and conductive cathode, comprising:
    depositing a first layer;
    depositing a second layer on the first layer;
    depositing a third layer on the second layer; and exposing the first layer, the second layer, and the third layer to a medium, wherein the substantially transparent and conductive cathode is produced by any one of: (1) the second layer reacts with the third layer; (2) the second layer reacts with the medium, and the third layer also reacts with the medium; (3) the first layer, the second layer, and the third layer react together, or (4) the first layer, the second layer, the third layer, and the medium react together, wherein the first layer is comprised of barium, calcium, magnesium, lithium, or a mixture thereof, and the second layer is comprised of silver or aluminum.

18. The method of claim 17 further comprising prior to depositing the first layer, depositing a barrier layer on the first layer.

19. The method of claim 17 wherein the third layer is comprised of a reactive metal.

20. The method of claim 17 wherein the medium is at least one of a gas and a liquid.

21. The method of claim 17 wherein the medium is comprised of at least one of argon, nitrogen, oxygen, moisture, residual solvent, and a mixture thereof.

22. The method of claim 17 wherein the transparency of the cathode is greater than sixty percent.

23. The method of claim 17 further comprising depositing a capping layer on the cathode.

24. A substantially transparent and conductive cathode, comprising:

a first layer;

a second layer on the first layer; and a third layer on the second layer, wherein the third layer is comprised of an alkaline earth metal, wherein the substantially transparent and conductive cathode is produced by exposing the first layer, the second layer, and the third layer to a medium, wherein any one of: (1) the second layer reacts with the third layer; (2) the second layer reacts with the medium, and the third layer also reacts with the medium; (3) the first layer, the second layer, and the third layer react together; or (4) the first layer, the second layer, the third layer, and the medium react together, wherein the first layer is comprised of an electron injecting material that has a thickness from about 1 nm to about 4 nm, the second layer is comprised of a conductive material that has a thickness from about 20 nm to about 30 nm, and the third layer is comprised of a reactive metal that has a thickness from about 20 nm to about 30 nm.

25. The cathode of claim 24 further comprising a barrier layer between the first layer and the second layer.

26. The cathode of claim 24 further comprising a capping layer deposited on the cathode.

27. The cathode of claim 24 wherein a low-reflectance absorber is on the cathode.

28. An organic electronic device comprising the cathode of claim 24.

* * * * *